US012661718B2

(12) United States Patent
    Waki et al.

(10) Patent No.: US 12,661,718 B2
(45) Date of Patent: Jun. 23, 2026

(54) COATED TOOL AND CUTTING TOOL

(71) Applicant: KYOCERA CORPORATION, Kyoto (JP)

(72) Inventors: Masahiro Waki, Satsumasendai (JP); Risa Koda, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 308 days.

(21) Appl. No.: 18/558,366

(22) PCT Filed: Feb. 15, 2022

(86) PCT No.: PCT/JP2022/005848
    § 371 (c)(1),
    (2) Date: Nov. 1, 2023

(87) PCT Pub. No.: WO2022/259623
    PCT Pub. Date: Dec. 15, 2022

(65) Prior Publication Data
    US 2024/0217000 A1       Jul. 4, 2024

(30) Foreign Application Priority Data
    Jun. 11, 2021    (JP) ................................. 2021-098119

(51) Int. Cl.
    *B32B 27/14*        (2006.01)
    *B23B 27/14*        (2006.01)
    *C23C 16/02*        (2006.01)
    *C23C 16/27*        (2006.01)

(52) U.S. Cl.
    CPC ........ *B23B 27/148* (2013.01); *C23C 16/0227* (2013.01); *C23C 16/271* (2013.01); *B23B 2228/105* (2013.01)

(58) Field of Classification Search
    None
    See application file for complete search history.

(56) References Cited

U.S. PATENT DOCUMENTS

2010/0003456 A1*    1/2010    Gussone ................. C23C 16/27
                                                                              427/122
2020/0024730 A1*    1/2020    Shikada .................... B23C 5/16
2020/0215620 A1    7/2020    Tsukihara et al.

FOREIGN PATENT DOCUMENTS

JP        2008-272863 A     11/2008
JP            6733947 B2      8/2020
WO      2018/174139 A1      9/2018

* cited by examiner

*Primary Examiner* — Alexandre F Ferre
(74) *Attorney, Agent, or Firm* — HAUPTMAN HAM, LLP

(57)        ABSTRACT

A coated tool in a non-limiting embodiment of the present disclosure includes a base composed of WC-based cemented carbide including a WC particle and a binding phase, and a diamond film located on the base. In a cross section orthogonal to a surface of the coated tool, the base has a lower content of the binding phase in a surface of the base than a midportion of the base. In an interface region between the base and the diamond film, a WC particle located away from the base is an isolated WC particle, and the number of the isolated WC particle present per interface length of 10 μm is 4 or less. A cutting tool in a non-limiting embodiment of the present disclosure includes the above coated tool.

6 Claims, 6 Drawing Sheets

COATED TOOL AND CUTTING TOOL

CROSS-REFERENCE TO RELATED APPLICATION

This application is a national stage entry according to 35 U.S.C. 371 of PCT Application No. PCT/JP2022/005848 filed on Feb. 15, 2022, which claims priority to Japanese Patent Application No. 2021-098119, filed Jun. 11, 2021. The contents of this application are incorporated herein by reference in their entirety.

TECHNICAL FIELD

The present disclosure relates to a coated tool and a cutting tool.

BACKGROUND

In a diamond-coated cutting tool having a diamond film coated on a tool base composed of WC-based cemented carbide, various proposals are made to improve adhesion between the tool base and the diamond film.

For example, WO 2018/174139 (Patent Document 1) discloses a cutting tool obtained by specifying a maximum difference of elevation of concave and convex, and a maximum distance between concave and convex in an interface between a tool base and a diamond film, as well as a length of a region where a binding phase is already removed, and a mean particle diameter of diamond crystals.

Further, Japanese Patent No. 6733947 (Patent Document 2) discloses a diamond-coated tool in which a diamond layer in the vicinity of a base includes crystal grains whose crystals grow in a random direction, in order to carry out machining with a long tool life even in a high efficiency machining of a difficult-to-cut material.

Conventionally, in cases where the diamond-coated tool is used for a high-efficiency and high-precision machining of a difficult-to-cut material, a film peeling tends to occur between the base and the diamond film during the machining, and tool life degrades, thus failing to use for a long-term stable machining.

SUMMARY

A coated tool in a non-limiting embodiment of the present disclosure includes a base composed of WC-based cemented carbide including a WC particle and a binding phase, and a diamond film located on the base. In a cross section orthogonal to a surface of the coated tool, the base has a lower content of the binding phase in a surface of the base than a midportion of the base. In an interface region between the base and the diamond film, a WC particle located away from the base is an isolated WC particle, and the number of the isolated WC particle present per interface length of 10 μm is 4 or less.

A cutting tool in a non-limiting embodiment of the present disclosure includes the above coated tool.

EMBODIMENT

<Coated Tools>

Figure 1:
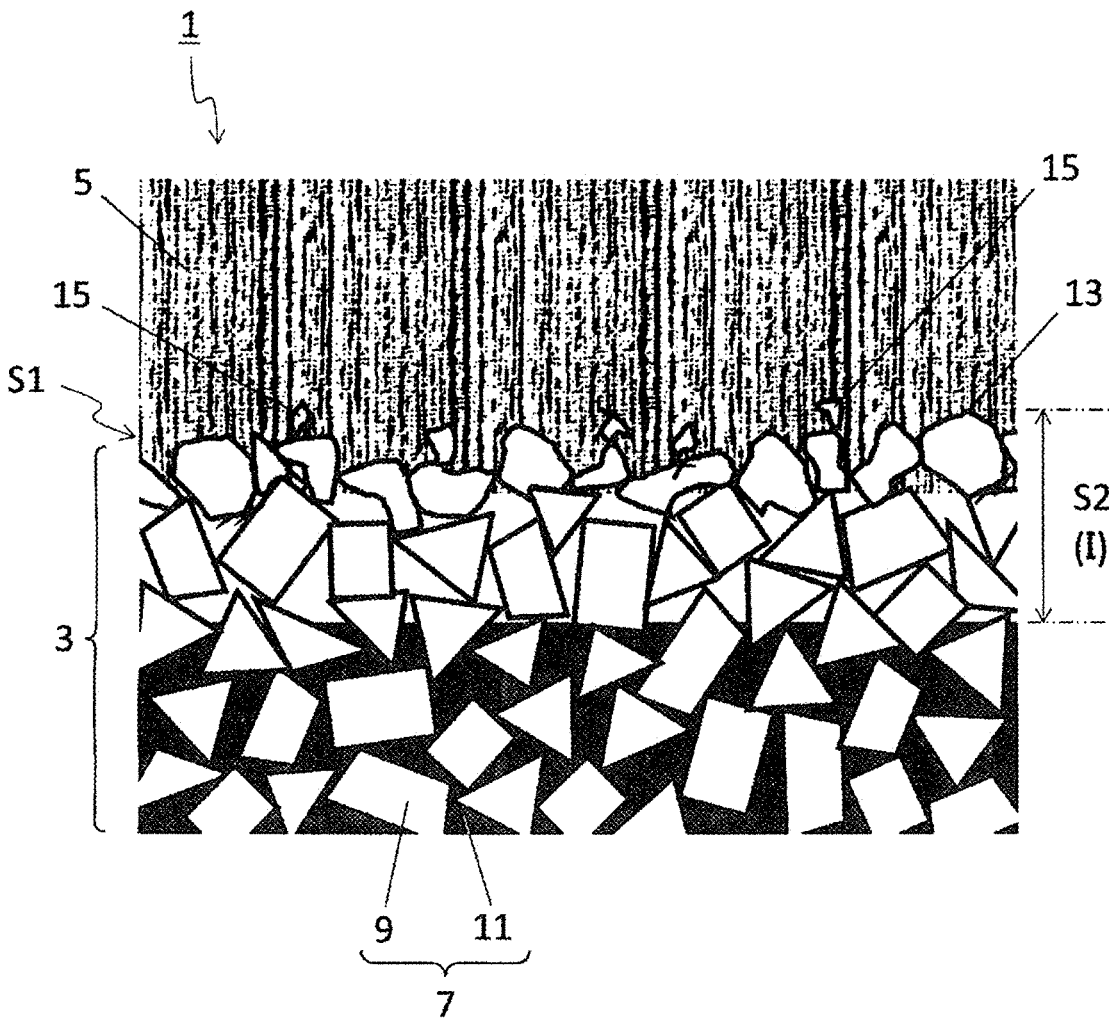
FIG. 1 is a diagram illustrating a coated tool in a non-limiting embodiment of the present disclosure, specifically, a schematic diagram of a cross section of the coated tool.

A coated tool 1 in a non-limiting embodiment of the present disclosure is described in detail below with reference to the drawings. For the convenience of description, the drawings referred to in the following illustrate, in simplified form, only main members necessary for describing the embodiments. The coated tool 1 may therefore include any arbitrary structural member not illustrated in the drawings referred to. Dimensions of the members in each of the drawings faithfully represent neither dimensions of actual structural members nor dimensional ratios of these members. These are also true for a cutting tool described later.

The coated tool 1 may include a base 3 and a diamond film 5 located on the base 3 as in a non-limiting embodiment illustrated in FIG. 1.

The base 3 may be composed of WC-based cemented carbide 7. The WC-based cemented carbide 7 may be referred to simply as the cemented carbide 7. The cemented carbide 7 may include a WC (tungsten carbide) particle 9 and a biding phase 11.

There may be a plurality of WC particles 9. The WC particle 9 can also be called a hard particle. The cemented carbide 7 may include a hard phase including a plurality of WC particles 9. The hard phase may include at least one kind selected from the group consisting of carbides, nitrides, and carbonitrides of group 4, group 5 and group 6 metals in the periodic table other than WC.

A mean particle diameter of the WC particles 9 is not limited to a specific value. For example, the mean particle diameter of the WC particles 9 may be 0.3-2.0 μm. The mean particle diameter of the WC particles 9 may be measured by image analysis. In this case, an equivalent circle diameter may be taken as the mean particle diameter of the WC particles 9. The mean particle diameter of the WC particles 9 may be measured in the following procedure. Firstly, a cross section of the base 3 was observed at 3000-5000× magnification with a Scanning Electron Microscope (SEM), thereby obtaining an SEM image. At least 50 pieces or more of the WC particles 9 in the SEM image may be identified and extracted. Thereafter, the mean particle diameter of the WC particles 9 may be obtained by calculating an equivalent circle diameter with the use of image analysis software ImageJ (1.52).

The binding phase 11 may serve to bind the WC particles 9 adjacent to each other. The binding phase 11 may also serve to bind hard phases adjacent to each other. The binding phase 11 may be composed of iron-group metals, such as Co (cobalt) and Ni (nickel).

The diamond film 5 may cover the whole or a part of a surface 13 of the base 3. If the diamond film 5 covers only the part of the surface 13 of the base 3, it may be said that the diamond film 5 is located on at least the part of the base 3.

The diamond film 5 may be deposited with chemical vapor deposition (CVD) method. In other words, the diamond film 5 may be a CVD film.

The diamond film 5 is not limited to a specific thickness. A thickness of the diamond film 5 may be set to, for example, 3-45 μm. The thickness of the diamond film 5 may be measured by, for example, a cross-section observation with an electron microscope. Examples of the electron microscope may include Scanning Electron Microscope (SEM).

In a cross section orthogonal to a surface of the coated tool 1, the base 3 may have a lower content of the binding phase 11 in the surface 13 of the base 3 than a midportion of the base 3. The term "the surface 13 of the base 3" as used herein may include not only the surface 13 but also a region in the vicinity thereof. Specifically, "the surface 3 of the base 3" may be rephrased as a near-surface of the base 3. The near-surface may mean a region with a depth of 10 μm from the surface 13 of the base 3. The near-surface may be a region with a depth in a film thickness direction of the diamond film 5, which extends from the WC particle 9 at the uppermost end of the base 3 to the deepest bottom part of the base 3. The term "a lower content of the binding phase 11" as used herein means, for example, a lower content of the binding phase 11 included per area in the cross section of the base 3. Alternatively, the content of the binding phase 11 on a straight line may be evaluated by a so-called line analysis.

The term "midportion of the base 3" as used herein may be rephrased as a midportion in a thickness direction of the base 3. The term "midportion of the base 3" as used herein may be, for example, a part including a rotation axis O described later (refer to FIG. 4, etc.). For example, a wavelength-dispersive type EPMA (WDS) may be used to check whether the content of the binding phase 11 is relatively low in the surface 13 of the base 3.

The WC particle 9 located away from the base 3 in an interface region S1 between the base 3 and the diamond film 5 is referred to as an isolated WC particle 15. The number of the isolated WC particles 15 present per interface length of 10 μm may be 4 or less. The term "interface length" as used herein may be a length of a straight line drawn along the surface 13 of the base 3.

If the isolated WC particle 15 not in contact with the WC particles 9 close to each other is present in the interface region S1, it is difficult to obtain good adhesion of the diamond film 5. If the number of the isolated WC particles 15 present per interface length of 10 μm is 4 or less, the diamond film 5 has good adhesion. Accordingly, the coated tool 1 having the above configuration has a long life. The isolated WC particle 15 may be measured by, for example, a cross-section observation with an electron microscope. The cross section may be a mirror surface.

The number of the isolated WC particles 15 present per interface length 10 μm may be 0 or more and 2 or less. The base 3 may include a region S2 where the content of the binding phase 11 is 15% or less in the surface 13 of the base 3, if the content of the binding phase 11 in the midportion of the base 3 is taken as 100%. A lower limit value of the content of the binding phase 11 in the region S2 may be 0%. To check whether the content of the binding phase 11 is 15% or less in the surface 13 of the base 3, a line analysis may be made from the midportion of the base 3 toward the surface 13 of the base 3 by the wavelength-dispersive type EPMA (WDS).

In a region having a low content of the binding phase 11 (the region where the content thereof is 15% or less) observed in an image obtained in an observation region which has a depth of 20 μm toward the inside of the base 3 from the interface between the diamond film 5 and the base 3, and which extends 20 μm in a direction parallel to the surface 13 of the base 3, a cross section observation may be made by the EPMA (WDS) to measure a depth from the interface between the diamond film 5 and the base 3 at a plurality of locations (for example, six locations). Then, a depth (length) of the region S2 having a low content of the binding phase 11 may be obtained by averaging measured values. An amount of the binding phase 11 may be obtained by measuring a cross section of a sample at a plurality of locations (for example, six locations) with Auger Electron Spectroscopy (AES), and by averaging measured values.

A length l of the region S2 having the low content of the binding phase 11 may be 1.0-5.0 μm. The term "length l of the region S2" as used herein means a length in a direction vertical to the surface of the base 3.

The length l of the region S2 having the low content of the binding phase 11 changes due to a surface treatment described later, such as etching process using an acid solution or an alkali solution. If the length l is 1.0 μm or more, a diamond film 5 with good quality can be deposited, and the diamond film 5 is less prone to adhesion degradation. If the length l is 5.0 μm or less, the interface between the base 3 and the diamond film 5 does not become vulnerable, and a side of the base 3 is less prone to cracks, thereby being less likely to become a cause of peeling of the diamond film 5. Therefore, the value of the length l may be set to 1.0-5.0 μm.

The region S2 having the low content of the binding phase 11 may be rephrased as the region S2 where the binding phase 11 of the base 3 is already removed. Removal of the binding phase 11 may be achieved by removal of the binding phase 11 included in the base 3 by, for example, a surface treatment using an acid solution. The base 3 is heated during deposition of the diamond film 5 after the surface treatment. Due to the heating, the binding phase 11 may be present again in a part of the region where the binding phase 11 is already removed once. Consequently, the length l of the region S2 where the binding phase 11 of the base 3 is already removed in the coated tool 1 may be shorter than a length of the region where the binding phase 11 is already removed with the acid solution.

Checking whether the content of the binding phase 11 is relatively low in the region S2 may be made in the same manner as in checking the content of the binding phase 11 in the surface 13 of the base 3. The region S2 may include a plurality of WC particles 9 and a gap located between the WC particles 9 adjacent to each other.

A mean particle diameter of the WC particles 9 in the interface region S1 may be smaller than a mean particle diameter of the WC particles 9 located in an inner part of the base 3 than the interface region S1. Specifically, the mean particle diameter of the WC particles in the interface region S1 may be less than 0.7 if the mean particle diameter of the WC particles in the inner part of the base 3 is taken as 1. In this case, the diamond film 5 tends to have good adhesion. If the WC particles 9 present in the interface region S1 have relatively large dimensions, it may have a bad influence on the adhesion of the diamond film 5.

<Method for Manufacturing Coated Tool>

A method for manufacturing a coated tool in a non-limiting embodiment of the present disclosure is described below.

Patent Document 1 discusses the steps of carrying out an alkali etching process and an acid etching process in a cemented carbide tool after a grinding process. However, with this method, unstable WC particles and isolated WC particles remain on the surface of the tool base after the acid etching process. Patent Document 1 further discusses subsequent ultrasonic processing in a solution including diamond powder in order to facilitate nucleation of diamond, but does not mention removal of the unstable WC particles and the isolated WC particles in the interface which have the most influence on the adhesion of the diamond film with respect to the base. Patent Document 2 discusses the step of carrying out a sand blast process in addition to an etching process. However, in cases where a cemented carbide base material is blasted using abrasive grains, a blast material pierces into between hard particles and a binding phase. This is one of the factors that degrade adhesion strength in a subsequent diamond film deposition.

In the manufacturing of the coated tool, a base may be prepared first. Firstly, a mixed powder may be prepared by mixing raw material powders, such as WC powder, metal Co powder, and $Cr_3C_2$ (chromium carbide) powder. Subsequently, a molded body may be obtained by molding the mixed powder into a predetermined tool shape with a known molding method, such as press molding, casting molding, extrusion molding, and cold isostatic pressing. Then, a base having a tool shape may be obtained by sintering the obtained molded body in a vacuum or a non-oxidizing atmosphere.

Subsequently, a surface of the base may be subjected to a surface treatment using an acid solution or an alkali solution. For the sake of convenience, the base before the surface treatment may be called an untreated base, and the base after the surface treatment may be called a base.

Firstly, the untreated base may be subjected to an etching process by being immersed in the alkali solution and the acid solution in this order. This etching process leads to a tendency that the content of the binding phase becomes lower in a surface of the base than a midportion of the base.

Examples of the alkali solution may include Murakami's Reagent (in which potassium hydroxide, potassium hexacyanoferrate (III), and pure water are mixed together at a mixing ratio of 10 g:10 g:100 ml). Immersion time of the untreated base in the alkali solution may be 20-50 min.

Examples of the acid solution may include hydrochloric acid, persulfate, and nitric acid. For example, if using nitric acid (concentration 1 mol/L), immersion time of the untreated base in the acid solution may be 5-30 min. The binding phase in the base is already removed from the surface of the base by the surface treatment using the acid solution. The binding phase at a deeper position can be removed by a longer period of the surface treatment.

If treatment time is set to five minutes or more, there is a tendency that a length l of a region having a low content of the binding phase after depositing the diamond film becomes 1.0 μm or more. If treatment time is set to 30 minutes or less, there is a tendency that the length l of the region having the low content of the binding phase after depositing the diamond film becomes 5.0 μm or less. With the coated tool having the above range of the length l of the region having the low content of the binding phase, the base and the diamond film tend to strongly adhere to each other.

In the surface treatment using the acid solution, the treatment may be carried out in an ultrasonic cleaner under the following conditions.

Output: 80-250 W

Time: 5-30 min.

A treatment using the ultrasonic cleaner may be carried out after the surface treatment. With this ultrasonic processing, it is possible to remove WC particles generated in the above surface treatment and then become isolated WC particles. The number of the isolated WC particles tends to be 4 or less per interface length of 10 μm depending on conditions of the ultrasonic processing.

Firstly, distilled water or an organic solvent may be prepared, and the untreated base may be immersed in a container kept under negative pressure. Thereafter, ultrasonic processing may be carried out, for example, under the following conditions where ultrasonic cleaning is carried out.

Apparatus: Ultrasonic disperser

Output: 600 W or more

Time: 10-120 min.

Negative pressure condition: 0.1-0.9 atm

Thereafter, a processing liquid in which diamond abrasive grains are loaded in an organic solvent may be prepared, and the untreated base may be immersed therein. A mean particle diameter of the diamond abrasive grains may be 0.5-10 μm. The mean particle diameter of the diamond abrasive grains may be a value measured with laser scattering method.

Subsequently, the ultrasonic processing may be carried out in a state where the untreated base is immersed in the processing liquid. The ultrasonic processing may be carried out, for example, under the following conditions.

Output: 250-500 W

Time: 5-30 min.

Subsequently, a diamond film may be deposited on an obtained base. The diamond film may be deposited with hot filament CVD method. An embodiment of the deposition method is described with reference to FIG. 2.

Figure 2:
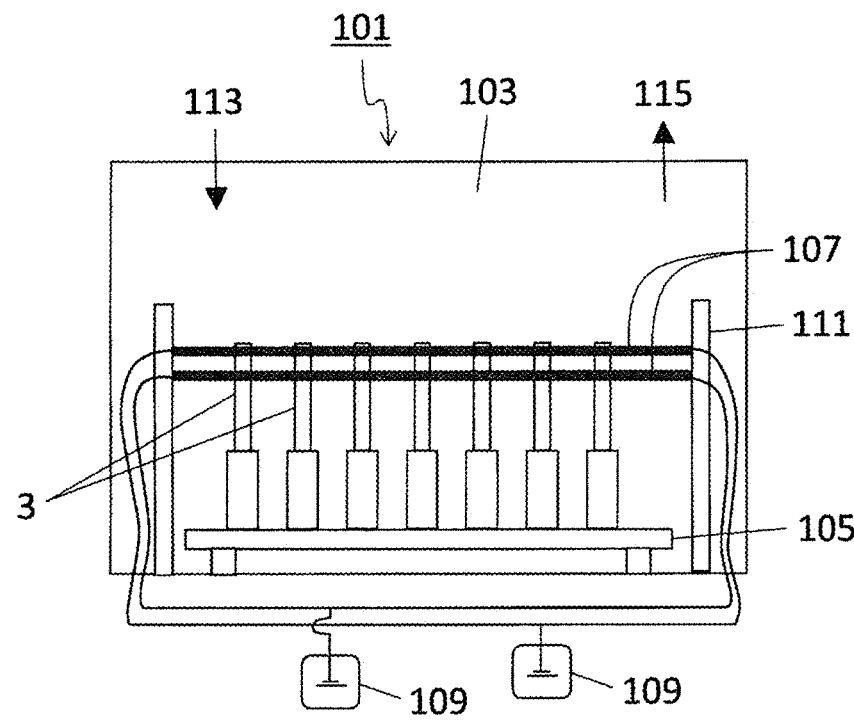
FIG. 2 is a schematic diagram illustrating a deposition apparatus used for manufacturing a coated tool in a non-limiting embodiment of the present disclosure.

A deposition apparatus 101 may include a reaction chamber 103 as in a non-limiting embodiment illustrated in FIG. 2. A specimen support 105 for setting the base 3 thereon may be disposed in the reaction chamber 103. If the base 3 has a bar shape, the base 3 may be set in an upright state so that a tip thereof can face upward.

A heater 107, such as a tungsten filament, may be disposed around the base 3. The heater 107 may be electrically connected to a power source 109 disposed outside the reaction chamber 103. The heater 107 may be supported on a support 111. There may be a plurality of heaters 107. The heaters 107 may be disposed so as to hold the base 3 therebetween. A temperature of the base 3 set on the specimen support 105 may be controlled by adjusting layout of the heaters 107 and a current value supplied to the heaters 107. The temperature of the base 3 may be controlled at, for example, 850-930° C.

The reaction chamber 103 may include a gas supply port 113 and a gas exhaust port 115. A reaction gas (deposition gas) may be supplied from the gas supply port 113 into the reaction chamber 103 kept in a vacuum. The reaction gas may include, for example, hydrogen gas and methane gas. The coated tool 1 may be obtained by depositing the diamond film 5 by spraying the reaction gas to the base 3.

The above manufacturing method is one of the methods for manufacturing the coated tool 1. Needless to say, the coated tool 1 is not limited to one which is manufactured by the above manufacturing method.

<Cutting Tool>

A cutting tool in a non-limited embodiment of the present disclosure is described in detail below by exemplifying the case of including the above coated tool 1 with reference to FIGS. 3 to 9.

The cutting tool may include the coated tool 1 as in the non-limiting embodiment illustrated in FIGS. 3 to 9. In this case, the coated tool 1 has a long life, and it is therefore possible to carry out a stable machining process over a long term.

Figure 3:
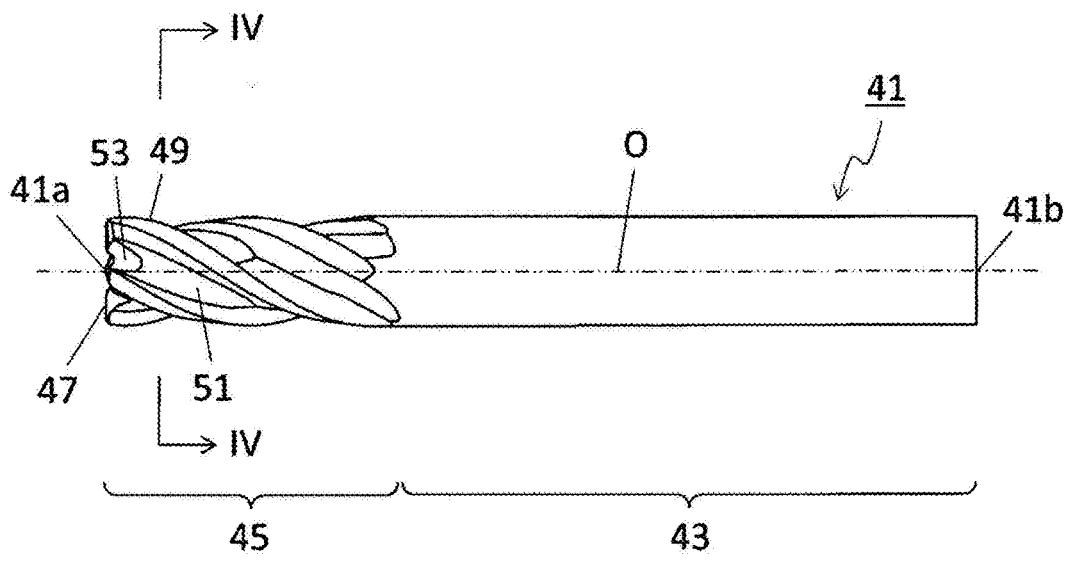
FIG. 3 is a side view illustrating a cutting tool (end mill) in a non-limiting embodiment of the present disclosure.
Figure 4:
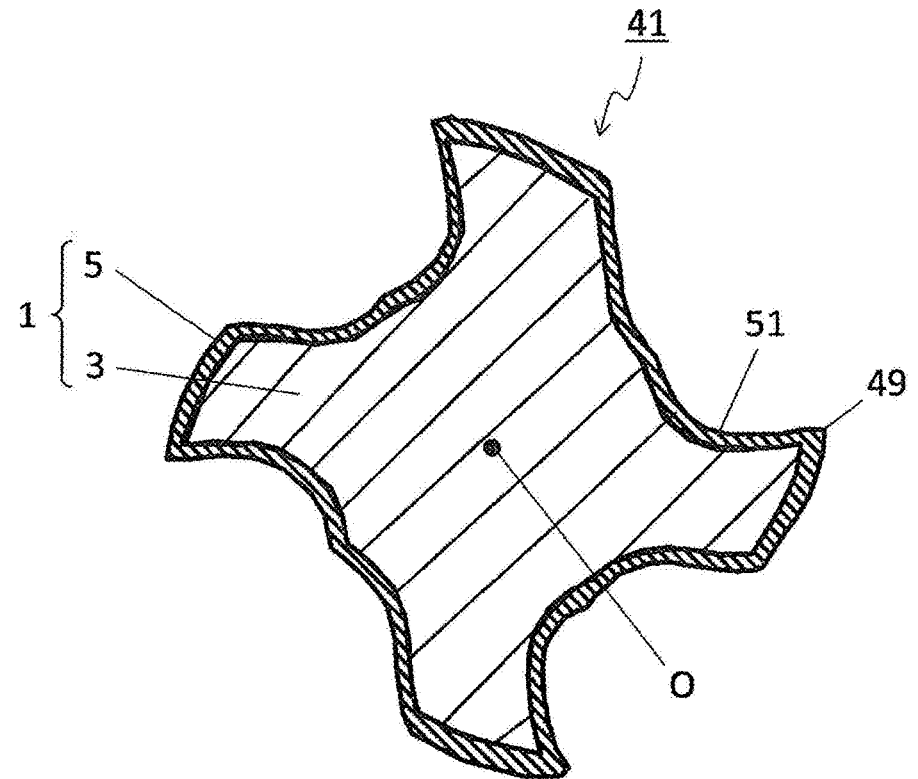
FIG. 4 is a sectional view of a cross section taken along line IV-IV in the cutting tool illustrated in FIG. 3.

The cutting tool may be an end mill 41 as in a non-limiting embodiment illustrated in FIGS. 3 and 4. The end mill 41 may have a bar shape extending along a rotation axis O from a first end 41a to a second end 41b. The end mill 41 may include a shank part 43 and a cutting part 45 located closer to the first end 41a than the shank part 43. The cutting part 45 may include a first cutting edge 47 (bottom cutting edge) located on a side of the first end 41a, a second cutting edge 49 (outer peripheral cutting edge) extending toward the second end 41b, a flute 51 extending toward the second end 41b, and a gash 53 located between the first cutting edge 47 and the flute 51.

Figure 5:
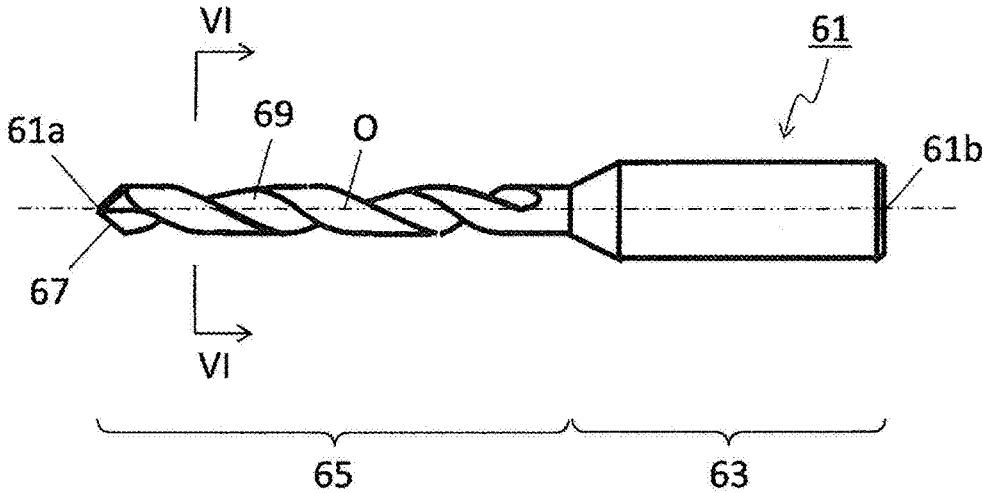
FIG. 5 is a side view illustrating a cutting tool (drill) in a non-limiting embodiment of the present disclosure.
Figure 6:
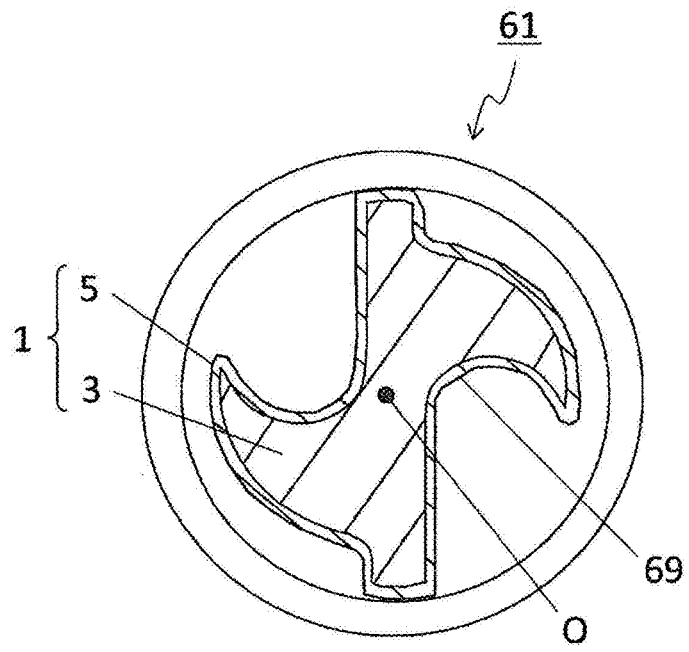
FIG. 6 is a sectional view of a cross section taken along line VI-VI in the cutting tool illustrated in FIG. 5.

The cutting tool may be a drill 61 as in a non-limiting embodiment illustrated in FIGS. 5 and 6. The drill 61 may have a bar shape extending along the rotation axis O from a first end 61a to a second end 61b. The drill 61 may include a shank part 63 and a cutting part 65 located closer to the first end 61a than the shank part 63. The cutting part 65 may include a cutting edge 67 located on a side of the first end 61a, and a flute 69 extending toward the second end 61b.

Figure 7:
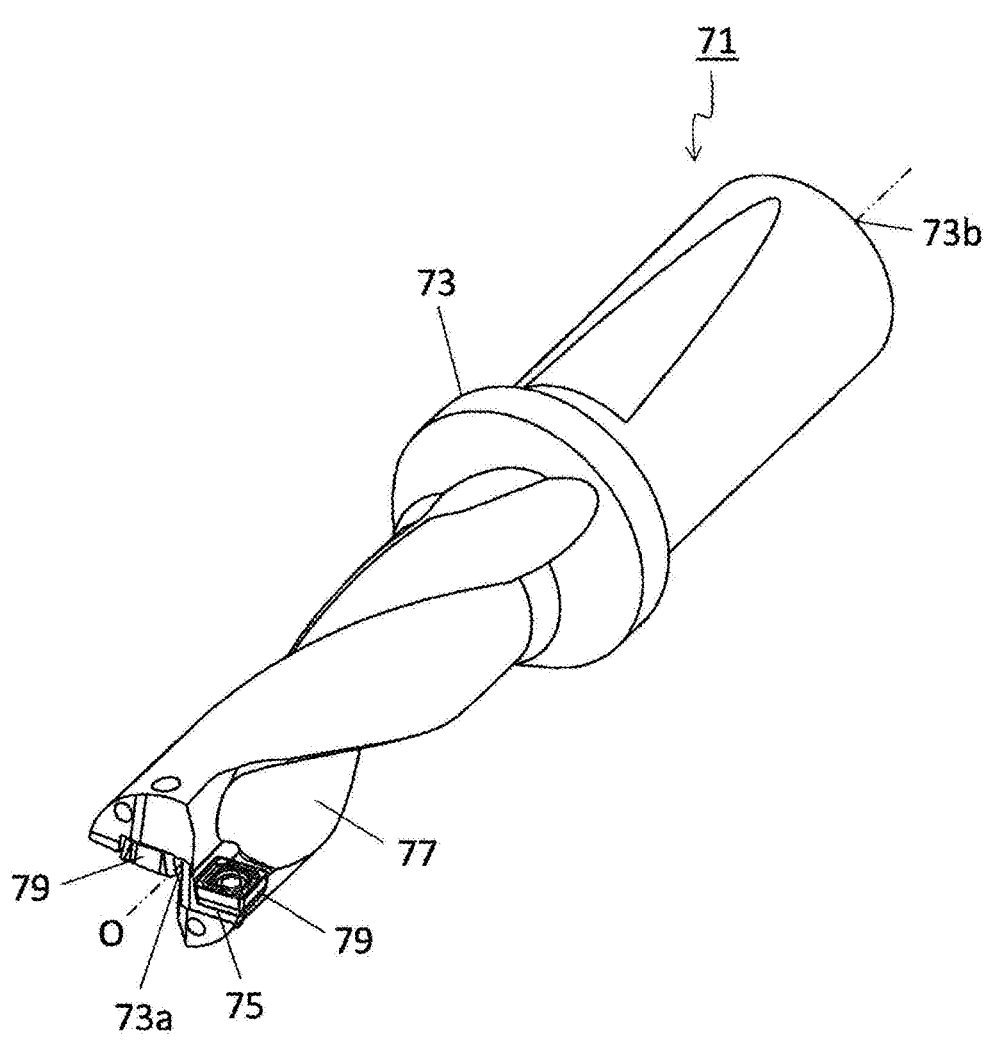
FIG. 7 is a perspective view illustrating a cutting tool (insert drill) in a non-limiting embodiment of the present disclosure.

The cutting tool may be an insert drill 71 as in a non-limiting embodiment illustrated in FIG. 7. The insert drill 71 may include a holder 73 having a bar shape extending along the rotation axis O from a first end 73a to a second end 73b and including a pocket 75 located on a side of the first end 73a, a flute 77 extending from the pocket 75 toward the second end 73b, and a cutting insert 79 having a polygonal plate shape (square plate shape) located in the pocket 75.

Figure 8:
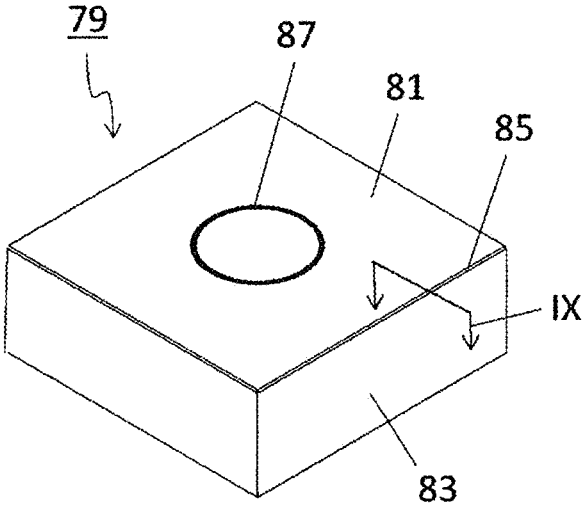
FIG. 8 is a perspective view illustrating a cutting insert in the cutting tool illustrated in FIG. 7.
Figure 9:
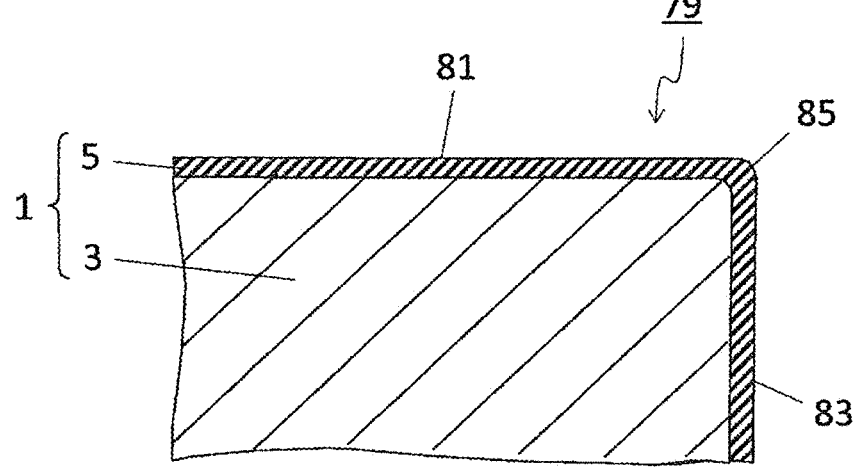
FIG. 9 is a sectional view of a cross section taken along line IX-IX in the cutting insert illustrated in FIG. 8.

The cutting insert 79 may include a first surface 81 (upper surface), a second surface 83 (lateral surface) adjacent to the first surface 81, a cutting edge 85 located on at least a part of a ridgeline part of the first surface 81 and the second surface 83, and a through hole 87 as in a non-limiting embodiment illustrated in FIGS. 8 and 9. The cutting insert 79 may include the coated tool 1.

The cutting tool is not limited to the embodiment exemplified above. The cutting tool may have a configuration used for a turning process. Examples of turning process may include internal diameter processing, external diameter processing, groove processing, and end face processing.

The coated tool 1 and the cutting tool in the non-limiting embodiments of the present disclosure have been exemplified above. Needless to say, however, the present disclosure is not limited to the foregoing embodiments, but may include any embodiment without departing from the scope of the present disclosure.

For example, even though the foregoing not-limiting embodiments have described the case of applying the coated tool 1 to the cutting tool, the coated tool 1 is applicable to other usage. Examples of other usage may include wear resistant parts such as sliding parts and metal molds, digging tools, tools such as blades, and impact resistant parts.

Although the present disclosure is described in detail below by giving Examples, the present disclosure is not limited to the following Examples.

EXAMPLES

[Samples Nos. 1 to 11]
(Coated Tool Manufacturing)

Firstly, a base was manufactured. Specifically, 7.0 mass % of metal Co powder, 0.8 mass % of $Cr_3C_2$ powder, and the rest that was WC powder having a mean particle diameter of 0.5 μm were added at their respective rates and mixed together, and then molded into a columnar shape, followed by sintering. This was subjected to the steps of centerless processing and sharpening process, thereby preparing an untreated base in the shape of an end mill (10 mm in end mill diameter, 30 mm in cutting edge length, 4-cutting edge).

Subsequently, a surface of the untreated base was subjected to a surface treatment. Specifically, an etching process was carried out by immersing the untreated base in an alkali solution (Murakami's Reagent for 20-45 minutes) and an acid solution (nitric acid 1 mol/L for 20 minutes) in this order. Specific immersion time in the alkali solution was presented in a column of alkali treatment in Table 1.

Thereafter, a container filled with distilled water was prepared, and the untreated base was immersed in the distilled water to carry out ultrasonic processing in the container at atmospheric pressure or kept under negative pressure by reducing pressure to 0.5 atm. In the ultrasonic processing, ultrasonic cleaning was carried out under conditions in a column of cleaning process presented in Table 1, such as ultrasonic output, ultrasonic time, and the presence/absence of negative pressure condition (negative pressure processing).

Thereafter, a processing liquid in which diamond abrasive grains having a mean particle diameter of 5 μm were loaded in an organic solvent was prepared, and the untreated base was immersed therein to carry out ultrasonic processing by an ultrasonic cleaner manufactured by Otari, Inc. under conditions of output of 400 W and time of 20 minutes.

The base after being subjected to the above processing was placed into the deposition apparatus illustrated in FIG. 2, and a diamond film was deposited on the surface of the base by hot filament CVD method. The deposition apparatus includes a tungsten filament (heater) having a thickness of 0.4 mmφ disposed in a reaction chamber having a diameter of 25 cmφ and a height of 20 cm. Specifically, a pair of filaments different in distance from the base was disposed on a side of a front end, and two pairs are disposed on a lateral surface so as to hold the base therebetween. That is, a total of six tungsten filaments were disposed. Deposition temperature was controlled to be at 900° C. The base having the end mill shape was set in an upright state so that a tip thereof could face upward. Subsequently, a diamond film was deposited in a vacuum by introducing a reaction gas whose composition was methane gas (4 capacity %) and hydrogen gas (the rest) from a gas supply port into the reaction chamber.

<Evaluations>

A machining test of the obtained coated tools was conducted under the following conditions to evaluate a machining distance and the presence/absence of peeling of a cutting edge after the test. Setting an upper limit of machining distance to 50 m and 1-pass to 5 m, the machining test was conducted until a peeling of the diamond film was observed at the cutting edge. In Samples in which peeling of a coating film was observed, the number of cutting edges whose coating film peeled off was evaluated. The results are present in Table 1.

(Machining Test Conditions)
Tool Shape: Cutting edge diameter: 10 mm, 4-cutting edge end mill
Machining Method: Shouldering process
Workpiece: CFRP
Rotational Frequency: 8000/min
Feed Rate: 0.02 mm/cutting edge
Depth of Cut: 5 mm in vertical cut, 5 mm in horizontal cut
Machining State: Dry

TABLE 1

| | Alkali | Cleaning process | | | Number of | WC particle | Machining test | |
| | treatment | Ultrasonic | Ultrasonic | Negative | isolated | diameter ratio | Machining | |
| Sample No. | Time (min) | time (min) | output (W) | pressure condition | WC particles (per 10 μm) | in interface region | distance (m) | Number of peeled off cutting edges |
| --- | --- | --- | --- | --- | --- | --- | --- | --- |
| 1 | 45 | 80 | 1200 | Present | 0 | 0.4 | 50 | None |
| 2 | 45 | 80 | 800 | Present | 1 | 0.4 | 45 | 1 cutting edge |
| 3 | 45 | 80 | 600 | Present | 2 | 0.4 | 40 | 1 cutting edge |
| 4 | 45 | 80 | 450 | Present | 5 | 0.4 | 15 | 2 cutting edges |
| 5 | 45 | 80 | 1200 | Absent | 1 | 0.4 | 45 | 1 cutting edge |
| 6 | 45 | 80 | 800 | Absent | 2 | 0.4 | 40 | 1 cutting edge |
| 7 | 45 | 80 | 600 | Absent | 4 | 0.4 | 25 | 2 cutting edges |
| 8 | 45 | 80 | 450 | Absent | 6 | 0.4 | 10 | 3 cutting edges |
| 9 | 20 | 80 | 600 | Present | 2 | 0.8 | 30 | 2 cutting edges |
| 10 | 25 | 80 | 600 | Present | 2 | 0.7 | 35 | 1 cutting edge |
| 11 | 45 | — | — | — | 9 | 0.4 | 5 | 4 cutting edges |

It was found that the coated tool of the present disclosure in which the number of isolated WC particles present per interface length of 10 μm was 4 or less had excellent machining performance.

In the bases of Samples Nos. 1 to 3, 5 to 7, 9, and 10, which are the coated tools of the present disclosure, the content of the binding phase in the surface of the base was lower than that in the midportion of the base. This was confirmed by the above-mentioned WDS.

In Samples Nos. 1 to 3, 5, 6, 9, and 10, in which the number of isolated WC particles was 0 or more and 2 or less, in the surface of the base, the base had a region having a low content of the binding phase where the content of the binding phase was 15% or less of the content of the binding phase in the midportion of the base. The length of the region having the low content of the binding phase was 1.0-5.0 μm. These were confirmed by the above-mentioned WDS and AES.

Measurement of "the number of isolated WC particles" presented in Table 1 was made by a cross-section observation using SEM. The term "WC particle diameter ratio in interface region" presented in Table 1 is a ratio of mean particle diameter of WC particles in the interface region if the mean particle diameter of WC particles in the inner part of the base is taken as 1. The mean particle diameter of WC particles contained in the base was measured by the above-mentioned image analysis.

DESCRIPTION OF THE REFERENCE
NUMERAL 1 coated tool
3 base
5 diamond film
7 WC-based cemented carbide
9 WC particle
11 binding phase
13 surface of base
15 isolated WC particle
31 cutting tool
41 end mill
41a first end
41b second end
43 shank part
45 cutting part
47 first cutting edge
49 second cutting edge
51 flute
53 gash
61 drill
61a first end
61b second end
63 shank part
65 cutting part
67 cutting edge
69 flute
71 insert drill
73 holder
73a first end
73b second end
75 pocket
77 flute
79 cutting insert
81 first surface
83 second surface
85 cutting insert
87 through hole
101 deposition apparatus
103 reaction chamber
105 specimen support
107 heater
109 power source
111 support
113 gas supply port
115 gas exhaust port
S1 interface region
S2 region having low content of binding phase
l length
O rotation axis

The invention claimed is:
1. A coated tool, comprising:
a base composed of WC-based cemented carbide comprising a WC particle and a binding phase; and
a diamond film located on the base, wherein the base comprises
    a first part, and
    a second part located closer to a midportion of the base than the first part,
the first part has a content of the binding phase lower than the second part,
in a cross section orthogonal to a surface of the coated tool in an interface region between the base and the diamond film,
    a further WC particle located away from the base is an isolated WC particle, and
    a number of the isolated WC particle present per interface length of 10 μm is 4 or less, and
a length of the first part from the interface region to the second part is above 2.0 μm and less than or equal to 5.0 μm.

2. The coated tool according to claim 1, wherein
the number of the isolated WC particle is 2 or less, and
the content of the binding phase in the first part is 15% or less of the content of the binding phase in the second part.

3. The coated tool according to claim 1, wherein
a ratio of a mean particle diameter of WC particles in the first part to a mean particle diameter of WC particles in the second part is less than 0.7.

4. The coated tool according to claim 1, wherein
the first part is located at a surface of the base, and
the second part is located at a midportion of the base.

5. The coated tool according to claim 1, wherein
the isolated WC particle is located in the diamond film.

6. A cutting tool, comprising:
a coated tool including
    a base composed of WC-based cemented carbide comprising a WC particle and a binding phase; and
    a diamond film located on the base, wherein
the base comprises
    a first part, and
    a second part located closer to a midportion of the base than the first part,
the first part has a content of the binding phase lower than the second part,
in a cross section orthogonal to a surface of the coated tool in an interface region between the base and the diamond film,
    a further WC particle located away from the base is an isolated WC particle, and
    a number of the isolated WC particle present per interface length of 10 μm is 4 or less, and
a length of the first part from the interface region to the second part is above 2.0 μm and less than or equal to 5.0 μm.

* * * * *